US012721174B2

(12) United States Patent
Miyaji

(10) Patent No.: US 12,721,174 B2
(45) Date of Patent: Aug. 25, 2026

(54) SEMICONDUCTOR DEVICE HAVING DIE RING CONDUCTOR

(71) Applicant: MICRON TECHNOLOGY, INC., Boise, ID (US)

(72) Inventor: Teppei Miyaji, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 495 days.

(21) Appl. No.: 18/482,663

(22) Filed: Oct. 6, 2023

(65) Prior Publication Data

US 2024/0213183 A1 Jun. 27, 2024

Related U.S. Application Data

(60) Provisional application No. 63/476,744, filed on Dec. 22, 2022.

(51) Int. Cl.

| | |
|---|---|
| ***H10W 42/00*** | (2026.01) |
| ***G11C 11/4074*** | (2006.01) |
| ***H10W 90/00*** | (2026.01) |

(52) U.S. Cl.

CPC ......... *H10W 42/00* (2026.01); *G11C 11/4074* (2013.01); *H10W 42/121* (2026.01); *H10W 90/00* (2026.01)

(58) Field of Classification Search

CPC ... H10W 42/00; H10W 42/121; H10W 90/00; G11C 11/4074; G01R 31/2856; G01R 31/2868; G01R 31/2879; G01R 31/2851; G01R 31/2853; H10P 74/203; H10P 74/207; H10P 74/273; H10P 74/277

See application file for complete search history.

(56) References Cited

U.S. PATENT DOCUMENTS

| | | | | |
|---|---|---|---|---|
| 8,310,034 B2 * | 11/2012 | Uchida | H10W 42/121 | 257/659 |
| 2012/0013359 A1 * | 1/2012 | Shao | G01R 31/318511 | 324/762.05 |
| 2014/0035106 A1 * | 2/2014 | Vu | H10P 54/00 | 257/E23.18 |
| 2014/0375341 A1 * | 12/2014 | Fender | H10W 20/40 | 438/618 |
| 2017/0025368 A1 * | 1/2017 | Brindle | H10W 42/00 | |
| 2018/0122754 A1 * | 5/2018 | Tatour | H10W 42/00 | |
| 2018/0364303 A1 * | 12/2018 | Werhane | G01R 31/3016 | |

* cited by examiner

*Primary Examiner* — John P. Dulka

(74) *Attorney, Agent, or Firm* — Dorsey & Whitney LLP

(57) ABSTRACT

An apparatus that includes first and second circuit blocks integrated on a semiconductor chip, and a die ring conductor provided along edges of the semiconductor chip so as to surround the first and second circuit blocks. The first circuit block includes a first die ring controller. The second circuit block includes a second die ring controller. One of the first and second die ring controllers is coupled to the die ring conductor such that another of the first and second die ring controllers is isolated from the die ring conductor.

20 Claims, 6 Drawing Sheets

SEMICONDUCTOR DEVICE HAVING DIE RING CONDUCTOR

CROSS REFERENCE TO RELATED APPLICATION(S)

This application claims priority to U.S. Provisional Application No. 63/476,744, filed Dec. 22, 2022. The aforementioned application is incorporated herein by reference, in its entirety, for any purpose.

BACKGROUND

Some semiconductor devices include a die ring provided along the peripheral edge of a chip. When a crack is generated on the periphery of a chip during dicing of a wafer, the die ring is isolated. Accordingly, the crack generated on the chip can be detected.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
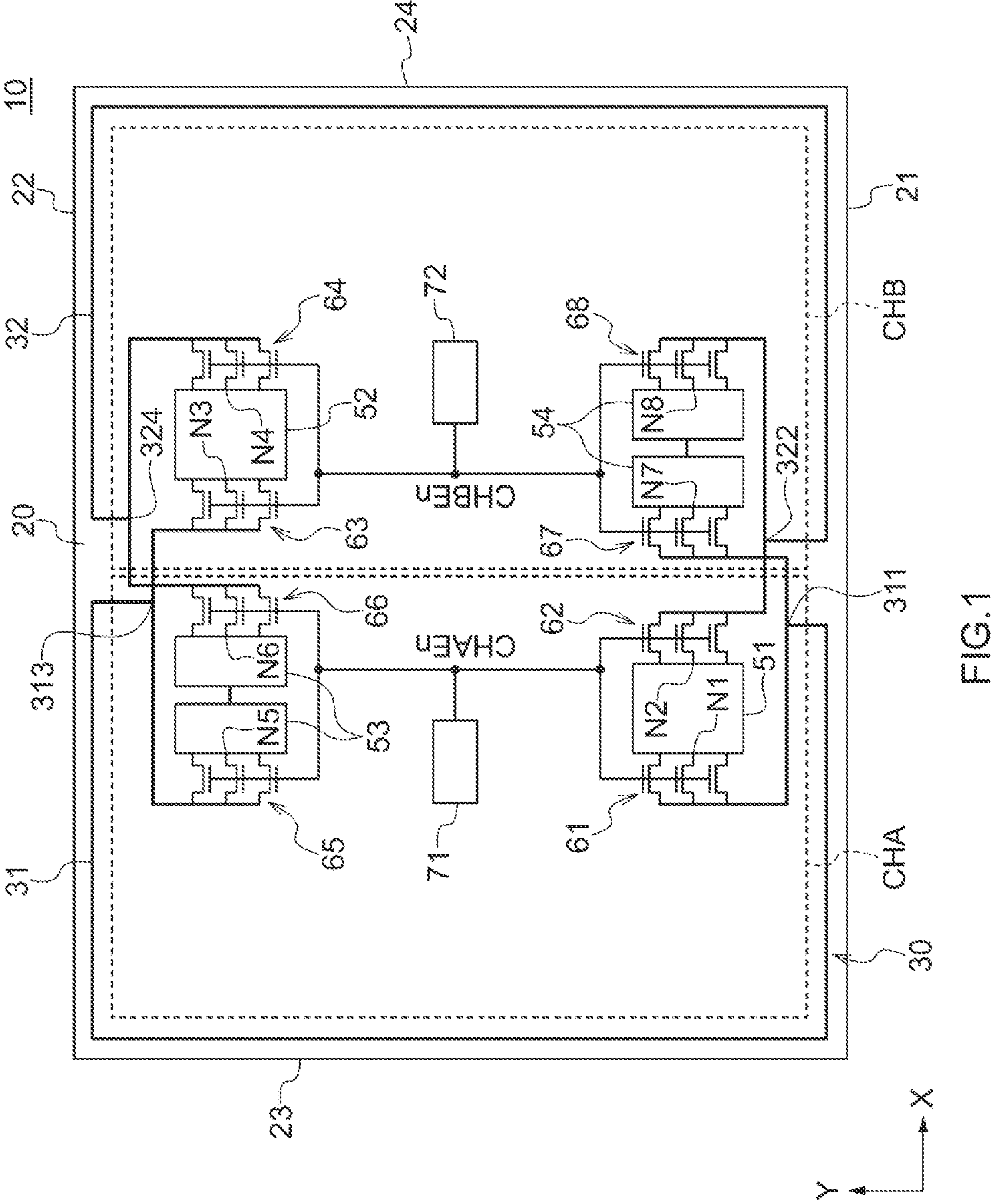
FIG. 1 is a schematic plan view for explaining a configuration of a semiconductor device according to one embodiment of the present disclosure.

FIG. 1 is a schematic plan view for explaining a configuration of a semiconductor device 10 according to one embodiment of the present disclosure. The semiconductor device 10 shown in FIG. 1 is integrated on a semiconductor chip 20 made of silicon, or the like. The semiconductor chip 20 includes edges 21 and 22 extending in an X direction, and edges 23 and 24 extending in a Y direction. In some examples, the X direction may be perpendicular to the Y direction. The semiconductor device 10 includes two channels CHA and CHB that can operate independently of each other.

Figure 2:
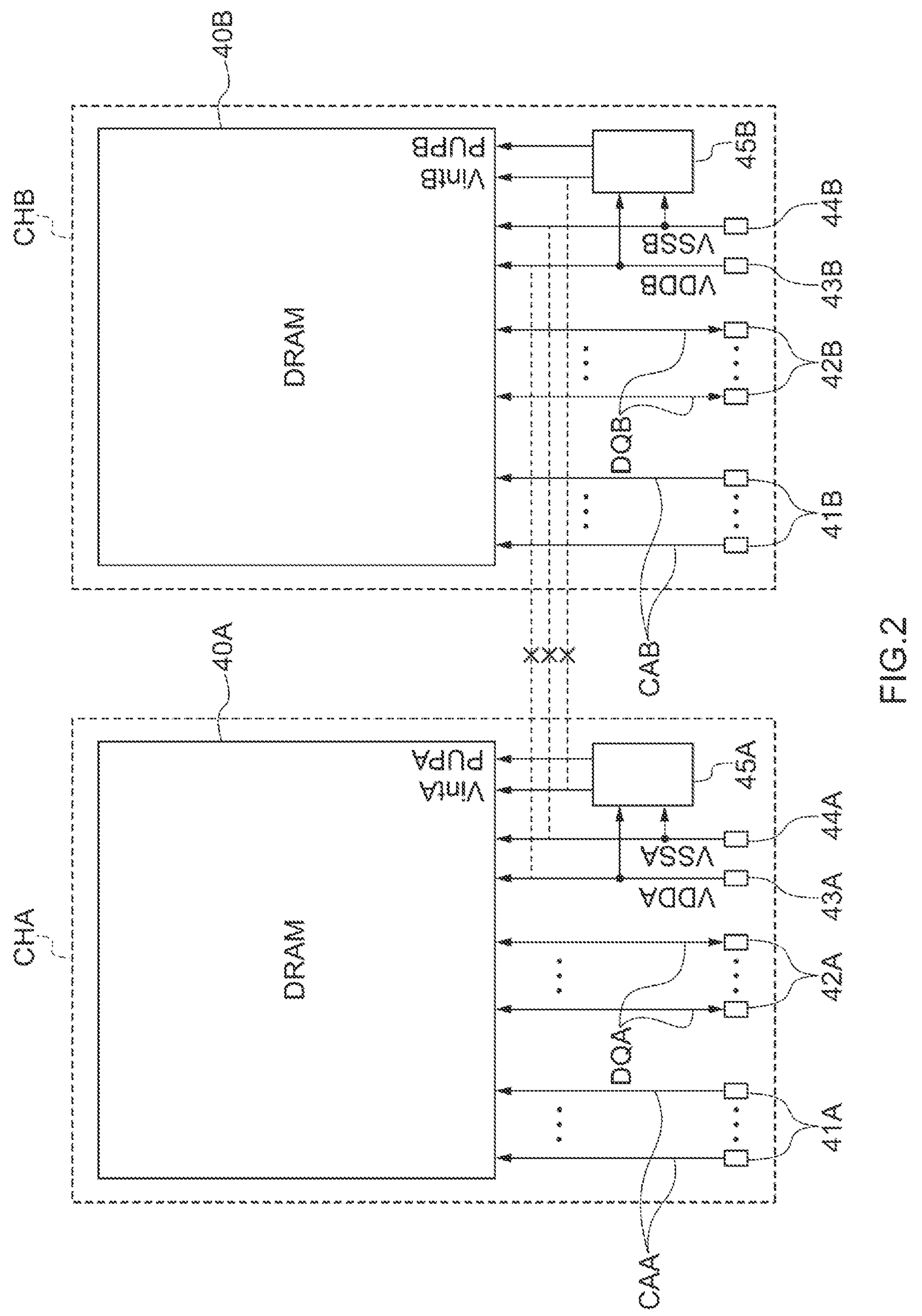
FIG. 2 is a block diagram for explaining a configuration of each channel.

As shown in FIG. 2, the channels CHA and CHB respectively include DRAMs (Dynamic Random Access Memories) 40A and 40B in the present embodiment. External terminals 41A to 44A allocated to the channel CHA are coupled to the DRAM 40A constituting the channel CHA, and external terminals 41B to 44B allocated to the channel CHB are coupled to the DRAM 40B constituting the channel CHB. Command address signals CAA and CAB are input to the external terminals 41A and 41B, respectively. User data DQA and DQB are input/output to/from the external terminals 42A and 42B, respectively. External power potentials VDDA and VDDB are supplied to the external terminals 43A and 43B, respectively. Ground potentials VSSA and VSSB are supplied to the external terminals 44A and 44B, respectively. A power line supplied with the external power potential VDDA and a power line supplied with the external power potential VDDB are independent of each other without being coupled to each other inside the semiconductor chip 20. Similarly, a power line supplied with the ground potential VSSA and a power line supplied with the ground potential VSSB are independent of each other without being coupled to each other inside the semiconductor chip 20. The channels CHA and CHB have internal power-up circuits 45A and 45B, respectively. The internal power-up circuit 45A generates an internal power potential VintA on the basis of the external power potential VDDA and the ground potential VSSA. The internal power-up circuit 45B generates an internal power potential VintB on the basis of the external power potential VDDB and the ground potential VSSB. The internal power potentials VintA and VintB are used as operating power for the DRAMs 40A and 40B, respectively. A power line supplied with the internal power potential VintA and a power line supplied with the internal power potential VintB are also independent of each other without being coupled to each other inside the semiconductor chip 20. The internal power-up circuit 45A activates a power-up signal PUPA to a high level when supplied with the external power potential VDDA. Similarly, the internal power-up circuit 45B activates a power-up signal PUPB to a high level when supplied with the external power potential VDDB. When the power-up signals PUPA and PUPB are activated, the DRAMs 40A and 40B are initialized, respectively.

As shown in FIG. 1, the channels CHA and CHB are surrounded by a die ring 30 extending along the edges 21 to 24. The die ring 30 includes a section 31 surrounding the channel CHA, and a section 32 surrounding the channel CHB. The section 31 extends along the edges 21 to 23. The section 32 extends along the edges 21, 22, and 24. The section 31 of the die ring 30 bifurcates at ends 311 and 313. The end 311 is coupled to a signal node N1 of a die ring controller 51 via a switch 61 and is coupled to a signal node N7 of a buffer circuit 54 via a switch 67. The end 313 is coupled to a signal node N5 of a buffer circuit 53 via a switch 65 and is coupled to a signal node N3 of a die ring controller 52 via a switch 63. The section 32 of the die ring 30 bifurcates at ends 322 and 324. The end 322 is coupled to a signal node N2 of the die ring controller 51 via a switch 62 and is coupled to a signal node N8 of the buffer circuit 54 via a switch 68. The end 324 is coupled to a signal node N6 of the buffer circuit 53 via a switch 66 and is coupled to a signal node N4 of the die ring controller 52 via a switch 64. The die ring controllers 51 and 52 are circuits for detecting isolation of the die ring 30 and belong to the channels CHA and CHB, respectively. The buffer circuits 53 and 54 are circuits for buffering signals output from the die ring controllers 51 and 52 and belong to the channels CHA and CHB, respectively.

Figure 3:
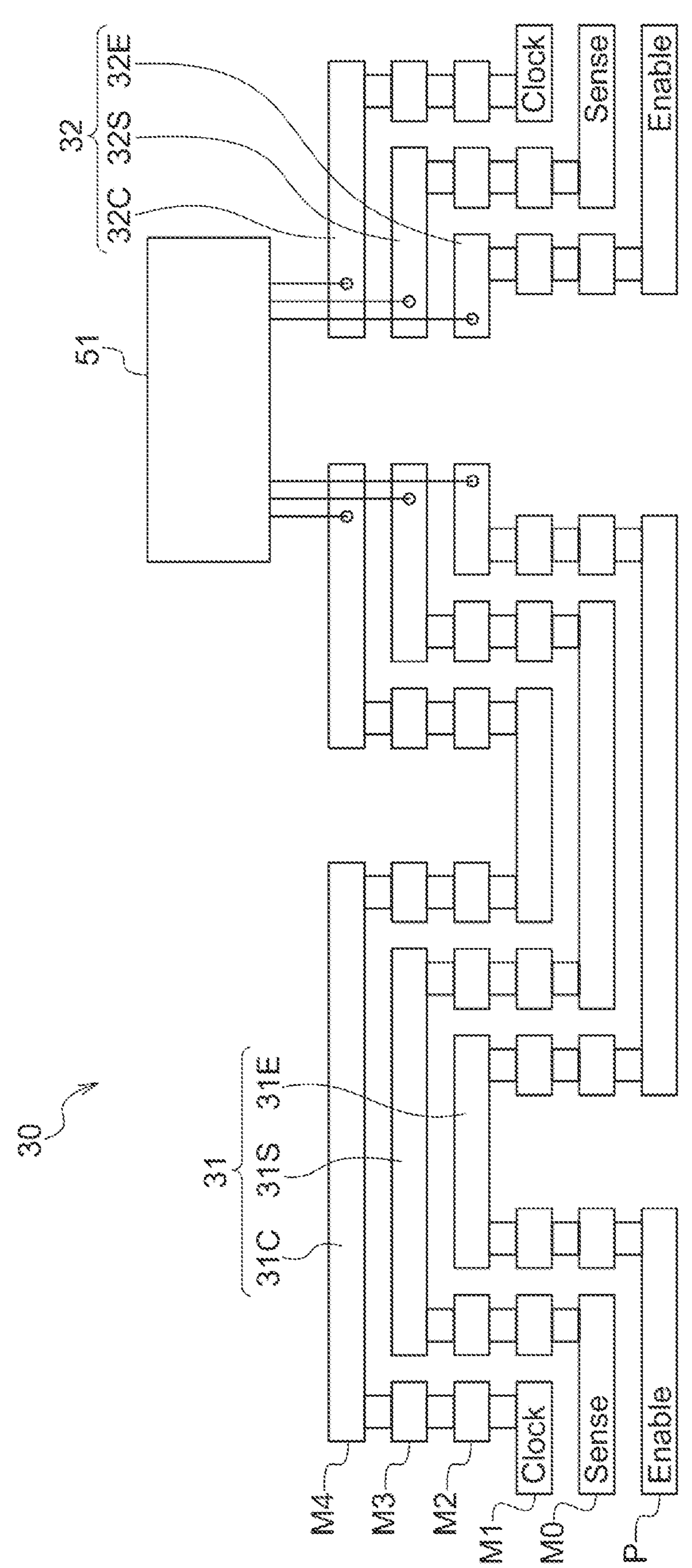
FIG. 3 is a schematic diagram for explaining an example of a configuration of a die ring.

FIG. 3 is a schematic diagram for explaining an example of a configuration of the die ring 30. In the example shown in FIG. 3, the die ring 30 is constituted of six conductor layers including a polysilicon layer P and metal layers M0 to M4. The section 31 of the die ring 30 is constituted of three lines including a clock line 31C, a sense line 31S, and an enable line 31E. Similarly, the section 32 of the die ring 30 is constituted of three lines including a clock line 32C, a sense line 32S, and an enable line 32E. The clock lines 31C and 32C are mainly formed in the metal layers M1 and M4, the sense lines 31S and 32S are mainly formed in the metal layers M0 and M3, and the enable lines 31E and 32E are mainly formed in the polysilicon layer P and the metal layer M2. In this way, the die ring 30 constitutes a wall-like conductor group including the six conductor layers. Since this wall-like conductor group is provided along the edges 21 to 24 of the semiconductor chip 20, the die ring 30 is isolated when a crack is generated on the periphery of the semiconductor chip 20 during dicing of a wafer. Isolation of the die ring 30 is detected by the die ring controller 51 or 52.

Figure 4:
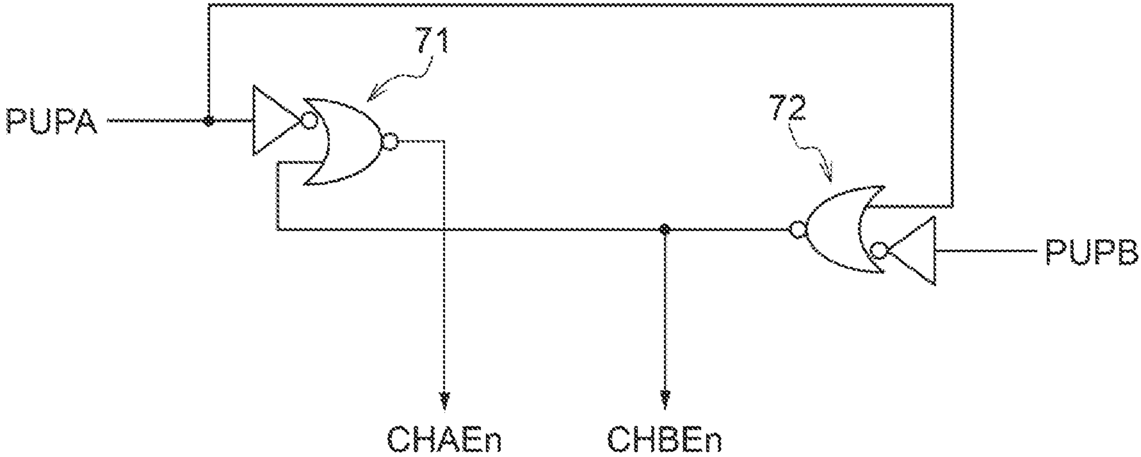
FIG. 4 is a circuit diagram of enable circuits.

As shown in FIG. 1, the switches 61, 62, 65, and 66 belonging to the channel CHA are turned on when an enable signal CHAEn is activated, and the switches 63, 64, 67, and 68 belonging to the channel CHB are turned on when an enable signal CHBEn is activated. The enable signal CHAEn is generated by an enable circuit 71 belonging to the channel CHA, and the enable signal CHBEn is generated by an enable circuit 72 belonging to the channel CHB. FIG. 4 is a circuit diagram of the enable circuits 71 and 72. As shown in FIG. 4, the enable circuit 72 includes a complex gate that receives the power-up signals PUPA and PUPB. The enable circuit 72 activates the enable signal CHBEn to a high level when the power-up signal PUPA has a low level and the power-up signal PUPB has a high level. The enable circuit 71 includes a complex gate that receives the power-up signal PUPA and the enable signal CHBEn. The enable circuit 71 activates the enable signal CHAEn to a high level when the power-up signal PUPA has a high level and the enable signal CHBEn has a low level. Accordingly, when the power-up signal PUPA is activated to a high level, the enable signal CHAEn is activated to a high level irrespective of the power-up signal PUPB. The enable signal CHBEn is activated to a high level only when the power-up signal PUPA is deactivated to a low level and the power-up signal PUPB is activated to a high level. In this way, the enable signal CHAEn is configured to be activated in priority to the enable signal CHBEn. Not both the enable signal CHAEn and the enable signal CHBEn are activated.

Figure 5:
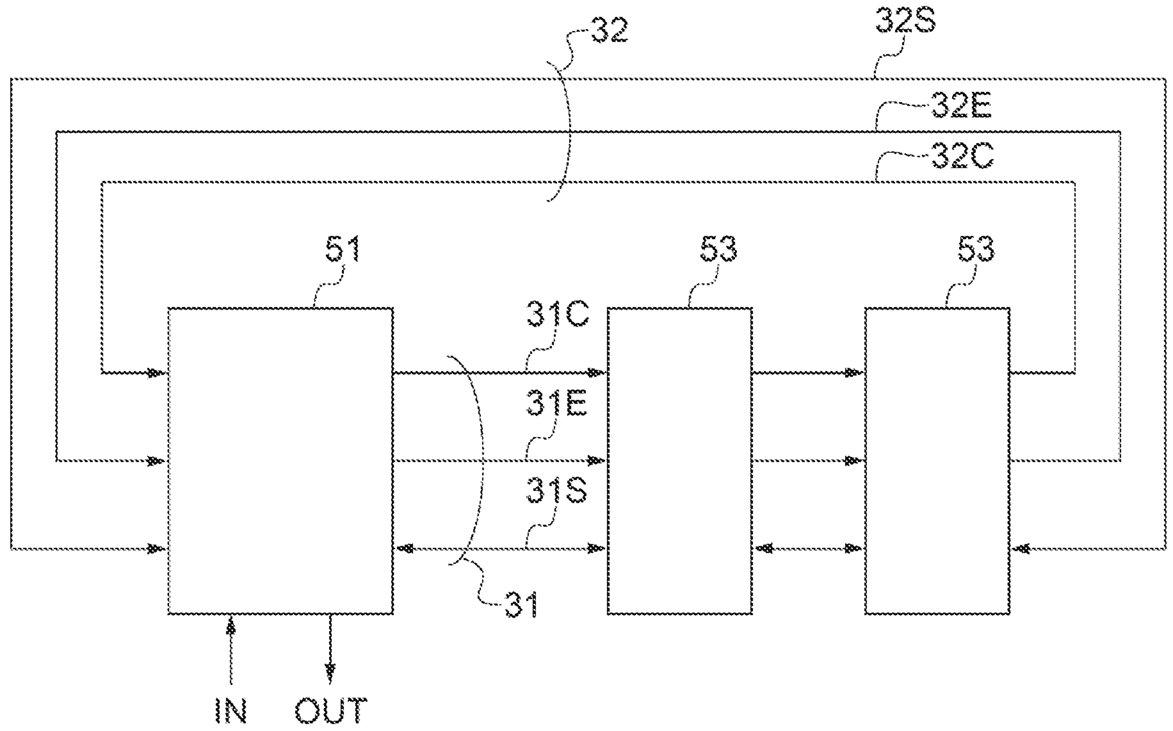
FIG. 5 is a circuit diagram showing a coupling relation between a die ring controller and a buffer circuit.

When the enable signal CHAEn is activated, the switches 61, 62, 65, and 66 are all turned on. Accordingly, the die ring controller 51 and the buffer circuit 53 are circularly coupled via the sections 31 and 32 of the die ring 30 as shown in FIG. 5. Therefore, when the die ring 30 is isolated due to a crack generated on the semiconductor chip 20, this is detected by the die ring controller 51. When an input signal IN is activated, the die ring controller 51 inputs and outputs a bidirectional sense signal to and from the sense lines 31S and 32S and outputs an enable signal and a clock signal to the enable lines 31E and 32E and the clock lines 31C and 32C, respectively. The sense signal is a signal for detecting the state of the die ring 30. The enable signal is a signal for activating internal circuits included in the die ring controller 51 and the buffer circuit 53. The clock signal is a timing signal for a circuit that performs a digital operation among the internal circuits included in the die ring controller 51 and the buffer circuit 53. The die ring controller 51 detects whether the die ring 30 is isolated using the sense signal, the enable signal, and the clock signal and outputs the detection result as an output signal OUT. Since the sense signal is a bidirectional signal, which of the sections 31 and 32 includes isolation of the die ring 30 can also be determined. The same holds for a case in which the enable signal CHBEn is activated. Since the switches 63, 64, 67, and 68 are all turned on, the die ring controller 52 and the buffer circuit 54 are circularly coupled via the sections 31 and 32 of the die ring 30.

With this circuit configuration, when the operation of the channel CHA is started with activation of the power-up signal PUPA, the enable signal CHAEn is activated, whereby the die ring controller 51 and the buffer circuit 53 are coupled to the die ring 30 while the die ring controller 52 and the buffer circuit 54 are isolated from the die ring 30. The die ring controller 51 and the buffer circuit 53 both belong to the channel CHA and operate with a voltage between the external power potential VDDA or the internal power potential VintA, and the ground potential VSSA. The same holds for a case in which both the operations of the channels CHA and CHB are started with activation of both the power-up signals PUPA and PUPB. In contrast thereto, when only the power-up signal PUPB is activated without activation of the power-up signal PUPA and accordingly only the channel CHB starts operating, the enable signal CHBEn is activated, whereby the die ring controller 52 and the buffer circuit 54 are coupled to the di ring 30 while the die ring controller 51 and the buffer circuit 53 are isolated from the die ring 30. The die ring controller 52 and the buffer circuit 54 both belong to the channel CHB and operate with a voltage between the external power potential VDDB or the internal power potential VintB, and the ground potential VSSB.

Figure 6:
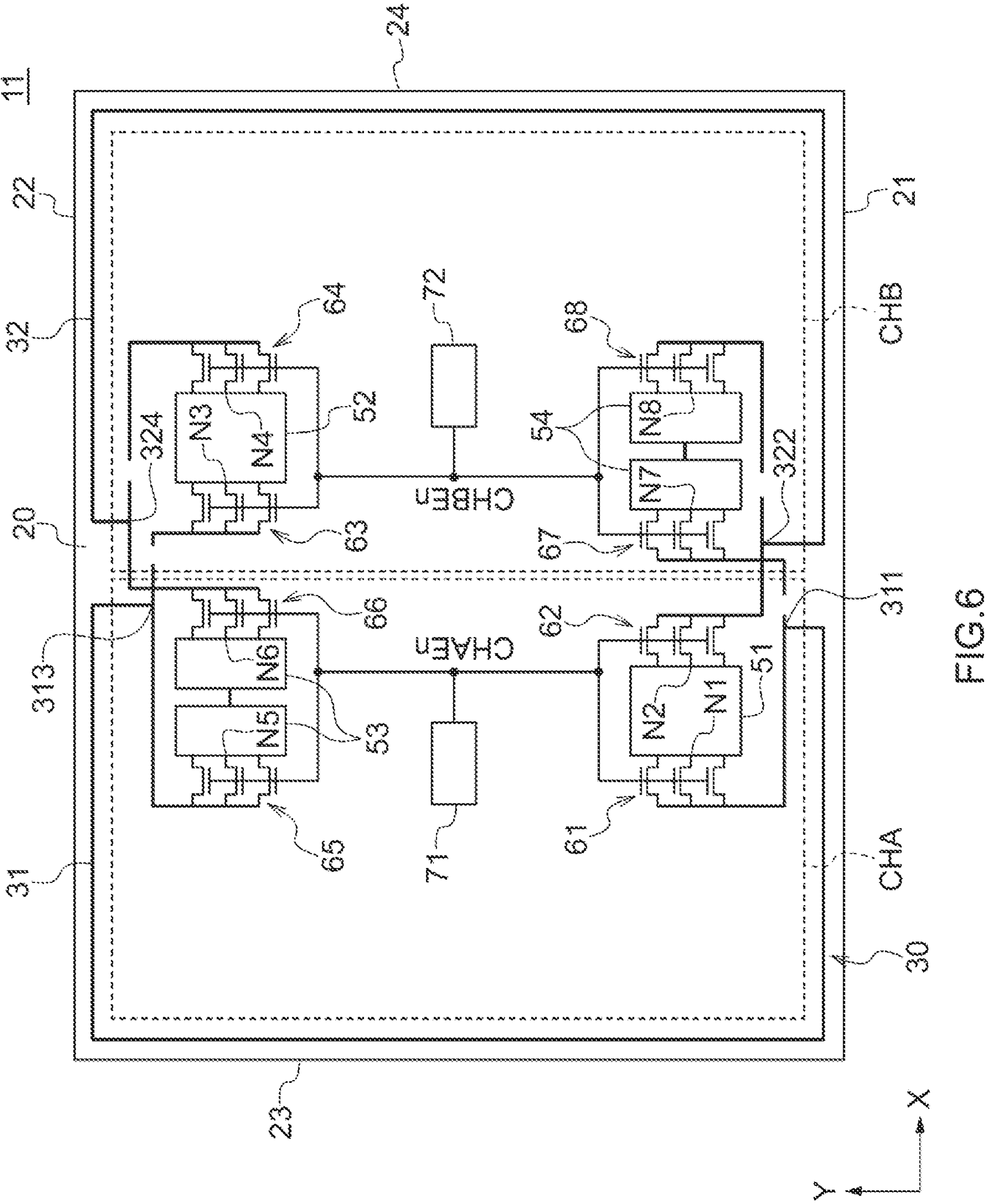
FIG. 6 is a schematic diagram for explaining an example of selecting coupling between the die ring and the channel by metal option.

As described above, the semiconductor device 10 according to the present embodiment includes the two channels CHA and CHB that can operate independently of each other, and power supplies used by these channels CHA and CHB are independent of each other. However, since either of the power supplies is used for control of the die ring 30, an unexpected malfunction can be prevented. Even when one of the channels CHA and CHB has a defect and only the other channel operates, the properly-operating channel automatically executes control of the die ring 30. Alternatively, the die ring 30 may be fixedly coupled to one of the channels using a so-called "metal option". In a semiconductor device 11 shown in FIG. 6, the die ring 30 is fixedly coupled to the die ring controller 51 and the buffer circuit 53 by isolating lines between the end 311 and the switch 67, between the end 313 and the switch 63, between the end 322 and the switch 68, and between the end 324 and the switch 64 with metal options. In this way, the channel coupled to the die ring 30 may be switched using metal options.

Although the embodiment has been explained above with an example of the semiconductor device 10 including the two channels CHA and CHB, the number of channels integrated on one semiconductor chip 20 is not limited to two, and three or more channels may be included. Further, the channels do not need to be DRAMs and may be any circuit blocks operating independently of each other.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

first and second circuit blocks integrated on a semiconductor chip; and a die ring conductor provided along edges of the semiconductor chip so as to surround the first and second circuit blocks, wherein the first circuit block includes a first die ring controller, wherein the second circuit block includes a second die ring controller, and wherein one of the first and second die ring controllers is coupled to the die ring conductor such that another of the first and second die ring controllers is isolated from the die ring conductor.

2. The apparatus of claim 1, wherein the first circuit block further includes a first enable circuit configured to generate a first enable signal, and wherein the first die ring controller is configured to be coupled to the die ring conductor when the first enable signal is activated.

3. The apparatus of claim 2, wherein the first circuit block further includes a first power-up circuit configured to generate a first power-up signal when a power voltage is supplied to the first circuit block, and wherein the first enable circuit is configured to activate the first enable signal responsive to the first power-up signal.

4. The apparatus of claim 2, wherein the second circuit block further includes a second enable circuit configured to generate a second enable signal, and wherein the second die ring controller is configured to be coupled to the die ring conductor when the second enable signal is activated.

5. The apparatus of claim 4, wherein the second circuit block further includes a second power-up circuit configured to generate a second power-up signal when a power voltage is supplied to the second circuit block, and wherein the second enable circuit is configured to activate the second enable signal when the second power-up signal is activated and the first power-up signal is deactivated.

6. The apparatus of claim 4, wherein the die ring conductor includes a first section having first and third ends and a second section having second and fourth ends, wherein the first die ring controller has first and second signal nodes, wherein the second die ring controller has third and fourth signal nodes, wherein the first circuit block further includes a first switch coupled between the first end of the first section of the die ring conductor and the first signal node of the first die ring controller and a second switch coupled between the second end of the second section of the die ring conductor and the second signal node of the first die ring controller, and wherein the second circuit block further includes a third switch coupled between the third end of the first section of the die ring conductor and the third signal node of the second die ring controller and a fourth switch coupled between the fourth end of the second section of the die ring conductor and the fourth signal node of the second die ring controller.

7. The apparatus of claim 6, wherein the first and second switches are configured to be controlled by the first enable signal, and wherein the third and fourth switches are configured to be controlled by the second enable signal.

8. The apparatus of claim 7, wherein the first circuit block further includes:

a first buffer circuit having fifth and sixth signal nodes;

a fifth switch coupled between the third end of the first section of the die ring conductor and the fifth signal node of the first buffer circuit; and a sixth switch coupled between the fourth end of the second section of the die ring conductor and the sixth signal node of the first buffer circuit, and wherein the second circuit block further includes:

a second buffer circuit having seventh and eighth signal nodes;

a seventh switch coupled between the first end of the first section of the die ring conductor and the seventh signal node of the second buffer circuit; and an eighth switch coupled between the second end of the second section of the die ring conductor and the eighth signal node of the second buffer circuit.

9. The apparatus of claim 8, wherein the fifth and sixth switches are configured to be controlled by the first enable signal, and wherein the seventh and eighth switches are configured to be controlled by the second enable signal.

10. The apparatus of claim 1, wherein the die ring conductor includes a first section having first and third ends and a second section having second and fourth ends, wherein the first die ring controller has first and second signal nodes, wherein the first circuit block further includes a first buffer circuit having fifth and sixth signal nodes, wherein the first signal node of the first die ring controller is coupled to the first end of the first section of the die ring conductor, wherein the second signal node of the first die ring controller is coupled to the second end of the second section of the die ring conductor, wherein the fifth signal node of the first buffer circuit is coupled to the third end of the first section of the die ring conductor, and wherein the sixth signal node of the first buffer circuit is coupled to the fourth end of the second section of the die ring conductor.

11. The apparatus of claim 10, wherein the second die ring controller has third and fourth signal nodes, and wherein the third and fourth signal nodes of the second die ring controller are isolated from the die ring conductor.

12. The apparatus of claim 11, wherein the second circuit block further includes:

a third switch having one end coupled to the third signal node of the second die ring controller and another end that is opened; and a fourth switch having one end coupled to the fourth signal node of the second die ring controller and another end that is opened.

13. The apparatus of claim 1, further comprising:

a first external power terminal supplied with a first power voltage; and a second external power terminal supplied with a second power voltage, wherein the first circuit block is configured to operate with the first power voltage, and wherein the second circuit block is configured to operate with the second power voltage.

14. The apparatus of claim 13, wherein the first and second circuit blocks are configured to operate independently.

15. The apparatus of claim 14, wherein each of the first and second circuit blocks includes a DRAM.

16. An apparatus comprising:

a die ring conductor provided along edges of a semiconductor chip, the die ring conductor includes a first section having first and third ends and a second section having second and fourth ends;

first and fourth circuits coupled in parallel between the first end of the first section of the die ring conductor and the second end of the second section of the die ring conductor;

second and third circuits coupled in parallel between the third end of the first section of the die ring conductor and the fourth end of the second section of the die ring conductor; and an enable circuit configured to enable one of the first and fourth circuits and enable one of the second and third circuits.

17. The apparatus of claim 16, further comprising:

a first external power terminal supplied with a first power voltage; and a second external power terminal supplied with a second power voltage, wherein the first and third circuits are configured to operate with the first power voltage, and wherein the second and fourth circuits is configured to operate with the second power voltage.

18. The apparatus of claim 17, wherein the first and second external power terminals are isolated from each other.

19. An apparatus comprising:

a die ring conductor provided along edges of a semiconductor chip, the die ring conductor includes a first section having first and third ends and a second section having second and fourth ends;

a first die ring controller having first and second signal nodes;

a first buffer circuit having fifth and sixth signal nodes;

a first switch coupled between the first end of the first section of the die ring conductor and the first signal node of the first die ring controller;

a second switch coupled between the second end of the second section of the die ring conductor and the second signal node of the first die ring controller;

a fifth switch coupled between the third end of the first section of the die ring conductor and the fifth signal node of the first buffer circuit; and a sixth switch coupled between the fourth end of the second section of the die ring conductor and the sixth signal node of the first buffer circuit.

20. The apparatus of claim 19, further comprising:

a second die ring controller having third and fourth signal nodes;

a third switch having one end coupled to the third signal node of the second die ring controller and another end that is opened; and a fourth switch having one end coupled to the fourth signal node of the second die ring controller and another end that is opened.

* * * * *